US011078692B2

(12) United States Patent
Spick et al.

(10) Patent No.: US 11,078,692 B2
(45) Date of Patent: Aug. 3, 2021

(54) METHOD FOR DETECTING A USER'S INTENTION TO LOCK OR UNLOCK A MOTOR VEHICLE DOOR AND ASSOCIATED DEVICE

(71) Applicants: Continental Automotive France, Toulouse (FR); Continental Automotive GmbH, Hannover (DE)

(72) Inventors: Gabriel Spick, Toulouse (FR); Mickael Guibbert, Toulouse (FR)

(73) Assignees: Continental Automotive France; Continental Automotive GmbH

(*) Notice: Subject to any disclaimer, the term of this patent is extended or adjusted under 35 U.S.C. 154(b) by 170 days.

(21) Appl. No.: 16/485,189

(22) PCT Filed: Feb. 17, 2017

(86) PCT No.: PCT/FR2017/050356
§ 371 (c)(1),
(2) Date: Aug. 12, 2019

(87) PCT Pub. No.: WO2018/150106
PCT Pub. Date: Aug. 23, 2018

(65) Prior Publication Data
US 2019/0368238 A1  Dec. 5, 2019

(51) Int. Cl.
*E05B 81/76* (2014.01)
*B60R 25/24* (2013.01)
(Continued)

(52) U.S. Cl.
CPC ............ *E05B 81/77* (2013.01); *B60R 25/245* (2013.01); *G01R 23/07* (2013.01); *H03K 17/954* (2013.01);
(Continued)

(58) Field of Classification Search
CPC ....... E05B 81/77; E05B 81/78; B60R 25/245; G01R 23/07; H03K 17/954; H03K 17/975; H03K 2217/94036; H03K 2217/96054
(Continued)

(56) References Cited

U.S. PATENT DOCUMENTS

2008/0024312 A1* 1/2008 Richter ................... E05B 81/78
340/573.1
2011/0043227 A1* 2/2011 Pance ..................... G06F 1/169
324/681
(Continued)

FOREIGN PATENT DOCUMENTS

DE    102005034035 A1    1/2007
EP       1211649 A1       6/2002
(Continued)

OTHER PUBLICATIONS

English Translation of Written Opinion for International Application No. PCT/FR2017/050356, dated Oct. 27, 2017, 8 pages.
(Continued)

*Primary Examiner* — Tomi Skibinski
(74) *Attorney, Agent, or Firm* — RatnerPrestia (57) ABSTRACT

A method for detecting the intention of a user to lock or unlock a motor-vehicle door with a detection device integrated into a handle. The method includes continuously measuring the resonant frequency of the detection device and successively comparing the measured resonant frequency to a first threshold representative of the approach of the user and to a second threshold, higher than the first threshold, representative of the contact of the user, the intention of the user to lock or unlock the door of the vehicle being validated only if a duration between the passage of the resonant frequency below the first threshold and the passage of the resonant frequency above the second threshold is shorter than a preset duration. An associated detection device is also disclosed.

10 Claims, 4 Drawing Sheets

(51) Int. Cl.
*G01R 23/07* (2006.01)
*H03K 17/95* (2006.01)
*H03K 17/975* (2006.01)
*E05B 81/78* (2014.01)

(52) U.S. Cl.
CPC ............ *H03K 17/975* (2013.01); *E05B 81/78* (2013.01); *H03K 2217/94036* (2013.01); *H03K 2217/96054* (2013.01)

(58) Field of Classification Search
USPC ........................................................ 324/652
See application file for complete search history.

(56) References Cited

U.S. PATENT DOCUMENTS

| | | | |
|---|---|---|---|
| 2016/0145909 A1* | 5/2016 | Guibbert | E05B 81/77 324/601 |
| 2016/0344386 A1 | 11/2016 | Buttolo et al. | |
| 2017/0016255 A1* | 1/2017 | Guibbert | E05B 81/76 |
| 2017/0235008 A1* | 8/2017 | Guibbert | E05B 81/78 324/679 |
| 2019/0368238 A1* | 12/2019 | Spick | H03K 17/975 |
| 2019/0383065 A1* | 12/2019 | Spick | E05B 81/77 |
| 2020/0047712 A1* | 2/2020 | Spick | G01L 1/14 |

FOREIGN PATENT DOCUMENTS

| | | |
|---|---|---|
| EP | 2595120 A2 | 5/2013 |
| FR | 3038642 A1 | 1/2017 |

OTHER PUBLICATIONS

International Search Report and Written Opinion for International Application No. PCT/FR2017/050356, dated Oct. 27, 2017—10 pages.

* cited by examiner

METHOD FOR DETECTING A USER'S INTENTION TO LOCK OR UNLOCK A MOTOR VEHICLE DOOR AND ASSOCIATED DEVICE

CROSS REFERENCE TO RELATED APPLICATION

This application is the U.S. National Phase Application of PCT International Application No. PCT/FR2017/050356, filed Feb. 17, 2017, the contents of such application being incorporated by reference herein.

FIELD OF THE INVENTION

The invention relates to a method for detecting the presence of a user and to a vehicle door handle comprising a detection device and the associated detection device.

BACKGROUND OF THE INVENTION

Nowadays, vehicle door handles are fitted with devices for detecting the presence of a user. The detection of the presence of a user, coupled with the recognition of a "hands-free" electronic fob for remote access control carried by said user, allows the remote locking and unlocking of the opening elements of the vehicle. Thus, when the user, carrying the corresponding electronic fob identified by the vehicle, wishes to unlock the vehicle, they approach the handle or touch the door handle of the vehicle, and the opening elements of the vehicle are then automatically unlocked. By approaching or by pressing on a precise location of the door handle of the vehicle, called "unlocking zone", the door (or alternatively all of the opening elements) is (are) unlocked without any other action from the user. Conversely, when the user, still carrying the necessary fob identified by the vehicle, wishes to lock their vehicle, they close the door of their vehicle and they approach or momentarily press on another precise location of the handle, called the "locking zone". This movement makes it possible to lock the opening elements of the vehicle automatically.

These presence detection devices generally comprise two capacitive sensors, in the form of two electrodes connected electrically to a printed circuit board and integrated into the door handle, each in a precise locking or unlocking zone. Generally, one electrode is dedicated to each zone, that is to say one electrode is dedicated to detecting the approach and/or the contact of the user's hand in the locking zone and one electrode is dedicated to detecting the approach and/or the contact of the user's hand in the unlocking zone.

The presence detection device further comprises a, generally LF (low-frequency), radiofrequency antenna. The detection device is connected to the vehicle's electronic computer (ECU: abbreviation for "electronic control unit") and sends it a presence detection signal. The electronic computer of the vehicle has, beforehand, identified the user as being authorized to access this vehicle, or alternatively, following the reception of this presence detection signal, it performs this identification. To this end, it sends an identification request to the fob (or to the remote controller) carried by the user by way of the radiofrequency antenna. This fob in response sends its identification code to the electronic computer of the vehicle through RF (radiofrequency) waves. If the electronic computer recognizes the identification code as the one authorizing access to the vehicle, it triggers the locking/unlocking of the door (or of all of the opening elements). If, on the other hand, the electronic computer has not received any identification code or if the received identification code is erroneous, locking or unlocking is not performed.

Such vehicles are therefore equipped with door handles comprising a detection device, itself comprising a generally low-frequency radiofrequency antenna, and two electrodes connected to a microcontroller, integrated into a printed circuit board and supplied with a voltage.

Purely for the sake of explanation, consideration will be given here to a detection device D comprising two electrodes, one electrode dedicated to the unlocking zone and one electrode dedicated to the locking zone, said two electrodes being connected to a printed circuit board comprising a microcontroller, and an LF antenna. A detection device D from the prior art is described with reference to FIG. 1.

Figure 1:
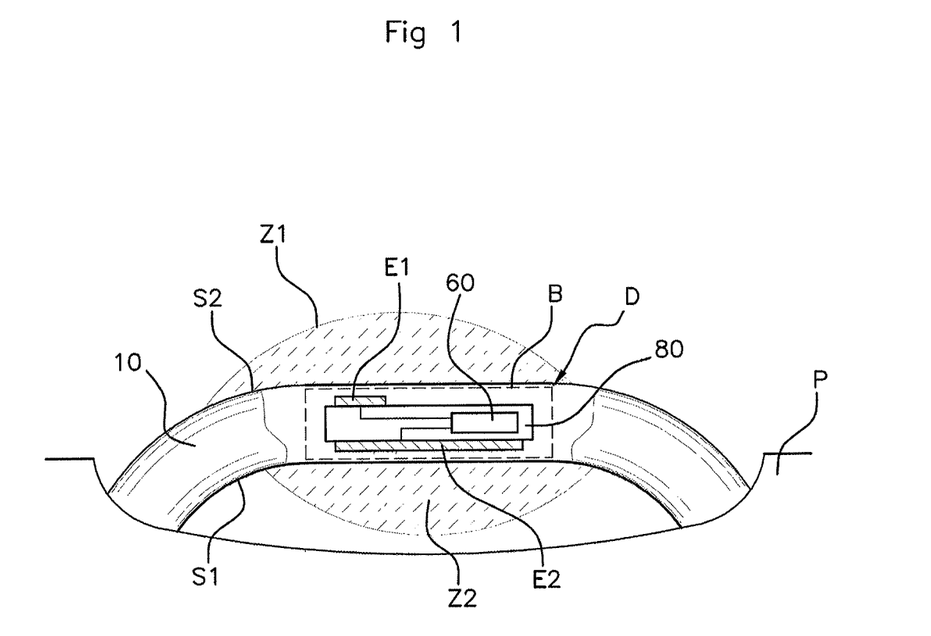
FIG. 1, which was described above, schematically shows the detection device D according to the prior art, integrated into a motor-vehicle door P handle 10, FIG. 2 schematically shows the detection device D' according to an aspect of the invention, integrated into a motor-vehicle door P handle 10, according to a first embodiment.

FIG. 1 shows a motor vehicle door handle 10 (vehicle not shown) in which there is situated a device D for detecting the presence of a user. Said door handle 10 comprises a first outer surface S1 oriented in the direction of the door P and a second outer surface S2, opposite the first outer surface S1 and therefore oriented on the side opposite the vehicle, more precisely toward the user (not shown). This detection device D comprises a first unlocking electrode E2, one face of which is situated close to the first outer surface S1 an LF antenna (not shown), one face of which is situated close to the second outer surface S2, a second locking electrode E1, one face of which is situated close to the second outer surface S2, and control means 60. The first and the second electrodes E1, E2 are connected to the control means 60. These control means 60 measure the capacitance across the terminals of each first and second electrode E1, E2 so as to detect the presence (the approach and/or the contact) of a user in the detection zones, that is to say in a locking zone Z1 or in an unlocking zone Z2, and consist for example of a microcontroller 60 integrated into a printed circuit board 80. The LF antenna (not shown) is for its part linked to an electronic computer on board the vehicle (not shown) of BCM ("body controller module") type, which manages the identification requests transmitted by said LF antenna.

However, this detection device D from the prior art exhibits major drawbacks.

Specifically, the detection of the approach of a user using capacitive sensors (first and second electrode E1 and E2) is not robust and generates false detections.

In particular, in some environmental conditions, when the ambient air is humid or when there is salt on the roads, which is spattered onto the metal bodywork of the vehicle, capacitive coupling is created between the detection zones (locking zone Z1 and unlocking zone Z2) and the metal parts of the vehicle, thereby preventing any detection of the presence of a user by the capacitive sensors.

In addition, raindrops or snowflakes on the door handle increase the capacitance measured by the capacitive sensors, thus triggering false detections.

Lastly, detection by capacitive sensors is incompatible with handles coated with metallic paints or comprising chromed surfaces, the presence of metal in the handle creating a coupling with the detection zones and inhibiting the detection of the presence of a user. While, for some vehicles, false detections are not desirable, for other vehicles, false detections are not tolerable.

This is the case for vehicles fitted with deployable handles, i.e. the case of handles for which the detection of the presence of the user controls the movement of a motorized handle which, when at rest, is completely incorporated within the door and, when activated, is deployed out of the door. For this type of handle, the unwanted deployment or retraction of the handle due to a false detection by the capacitive sensors risks hitting or squeezing the hand of the user.

This is also the case for vehicles provided with electrically assisted opening, for which the detection of unlocking is accompanied not only by the door being unlocked but also by it opening. In this case, false detections result in unwanted openings of the door.

Lastly, false detections are not tolerable for vehicles provided with the "safe lock" security function, for which the detection of locking controls not only the locking of the vehicle from the outside but also the locking of the vehicle from the inside (anti-theft device). In this case, false detections may lead to the user being shut inside the vehicle.

To remedy these drawbacks, it is known in the prior art to replace at least one of the capacitive sensors, for example the capacitive sensor dedicated to the locking of the vehicle, with a mechanical switch of push-button type, but the aesthetic appearance and ergonomics of a button on a handle are unsatisfactory to users. For example, the button may be seen from the exterior and it is not suitable for deployable handles where discretion with regard to the presence of the handle in the door is above all sought.

Furthermore, pressing on a pushbutton is less comfortable for the user than automatic detection of the approach of his hand toward the handle, which requires no press on his part.

It is also known to replace at least one of the capacitive sensors with an inductive sensor comprising a metal target that moves toward a coil of the sensor during the press of the user on the locking or unlocking zone. The variation in inductance of the coil of the inductive sensor, due to the approach of the target, allows the detection of the intention of the user with regards to locking or unlocking to be validated. However, this type of sensor also has a drawback, because it is sensitive to the vibrations of the vehicle, and to the shocks generated when doors are slammed. It is therefore also liable to generate false detections.

SUMMARY OF THE INVENTION

An aspect of the present invention allows these drawbacks to be solved and proposes a method and device for detecting the intention to lock and/or unlock for a motor-vehicle door handle not having the drawbacks of the prior art.

In particular, the detection method according to an aspect of the invention allows reliable and robust detection of the intention to unlock or lock the vehicle, preventing false detections, and the detection device according to an aspect of the invention has a discrete aesthetic appearance and is ergonomical, allowing the user to benefit from a maximum of comfort, safety and performance.

An aspect of the invention proposes a method for detecting the intention of a user to lock or unlock a motor-vehicle door with a detection device integrated into a handle, said method being noteworthy in that it comprises continuously measuring the resonant frequency of said detection device and successively comparing said measured resonant frequency to a first threshold representative of the approach of the user and to a second threshold, higher than the first threshold, representative of the contact of the user, the intention of the user to lock or unlock the door of the vehicle being validated only if: the value of the measured resonant frequency is firstly lower than a first threshold, at a first measured time, then higher than the second threshold, at a second measured time and a duration between the second time and the first time is shorter than a preset duration.

Thus, by only measuring the resonant frequency of the detection device, the detection method of an aspect of the invention allows the approach of a user toward the handle, then the contact of the user on the handle to be successively detected, the succession of the two actions in a preset duration being necessary in order to validate the intention of the user to lock or unlock the door of the vehicle.

An aspect of the invention also relates to a device for detecting the intention of a user to lock or unlock a motor-vehicle door, said device being integrated into a handle and powered by a voltage source, and being noteworthy in that it comprises:
- a coil,
- a movable electrode a first face of which is oriented toward the handle, and a second face of which is located facing the coil, said movable electrode being able to move from a rest position, located in proximity to the handle, to a final position, located in proximity to the coil, under the effect of a contact of the user on the handle,
- a capacitor connected to ground, the movable electrode, the coil and the capacitor being connected together in order to form a resonant circuit a resonant frequency of which varies as a function of a variation in the capacitance of the movable electrode, and as a function of the position of the movable electrode, said resonant frequency decreasing when the user approaches the handle and increasing when the user grips the handle and the electrode moves to the final position,
- means for oscillating the frequency of said resonant circuit and means for measuring a resonant frequency of said resonant circuit,
- means for comparing the resonant frequency to a first threshold and to a second threshold,
- means for controlling the frequency-oscillating means, the measuring means and the frequency-comparing means,
- a clock,
- means for storing times in memory, said means being able to store the first time of passage of the resonant frequency below a first threshold and a second time of passage of the resonant frequency above a second threshold,
- means for computing a duration between the first time and the second time,
- means for comparing said duration with a preset duration.

Preferably, a first terminal of the coil is connected to the movable electrode and a second terminal of the coil is connected to the capacitor.

Advantageously, the coil and the capacitor are located on a printed circuit board and the movable electrode is able to move by way of a conductive flexible link electrically connecting said movable electrode to the printed circuit board and having a pivot point.

Judiciously, the frequency-oscillating means, the measuring means and the frequency-comparing means are located on the printed circuit board.

In one preferred embodiment, the detection device is integrated into a casing comprising a first portion, which is elastically deformable along a preset axis, having a zone of contact with the handle, and the movable electrode is, in a rest position, in contact with the first portion, and in a final position is in proximity to the coil.

An aspect of the invention also relates to a motor-vehicle door handle, comprising a device according to one of the features listed above. In the preferred embodiment, the handle also comprises at least one elastically deformable zone aligned along the preset axis with the zone of contact, of dimensions larger than or equal to the dimensions of the zone of contact.

An aspect of the invention applies to any motor vehicle comprising a device according to any one of the features listed above.

BRIEF DESCRIPTION OF THE DRAWINGS

Other features and advantages of an aspect of the invention will become apparent upon reading the description that will follow and upon examining the appended drawings in which.

DETAILED DESCRIPTION OF THE PREFERRED EMBODIMENTS

Figure 2:
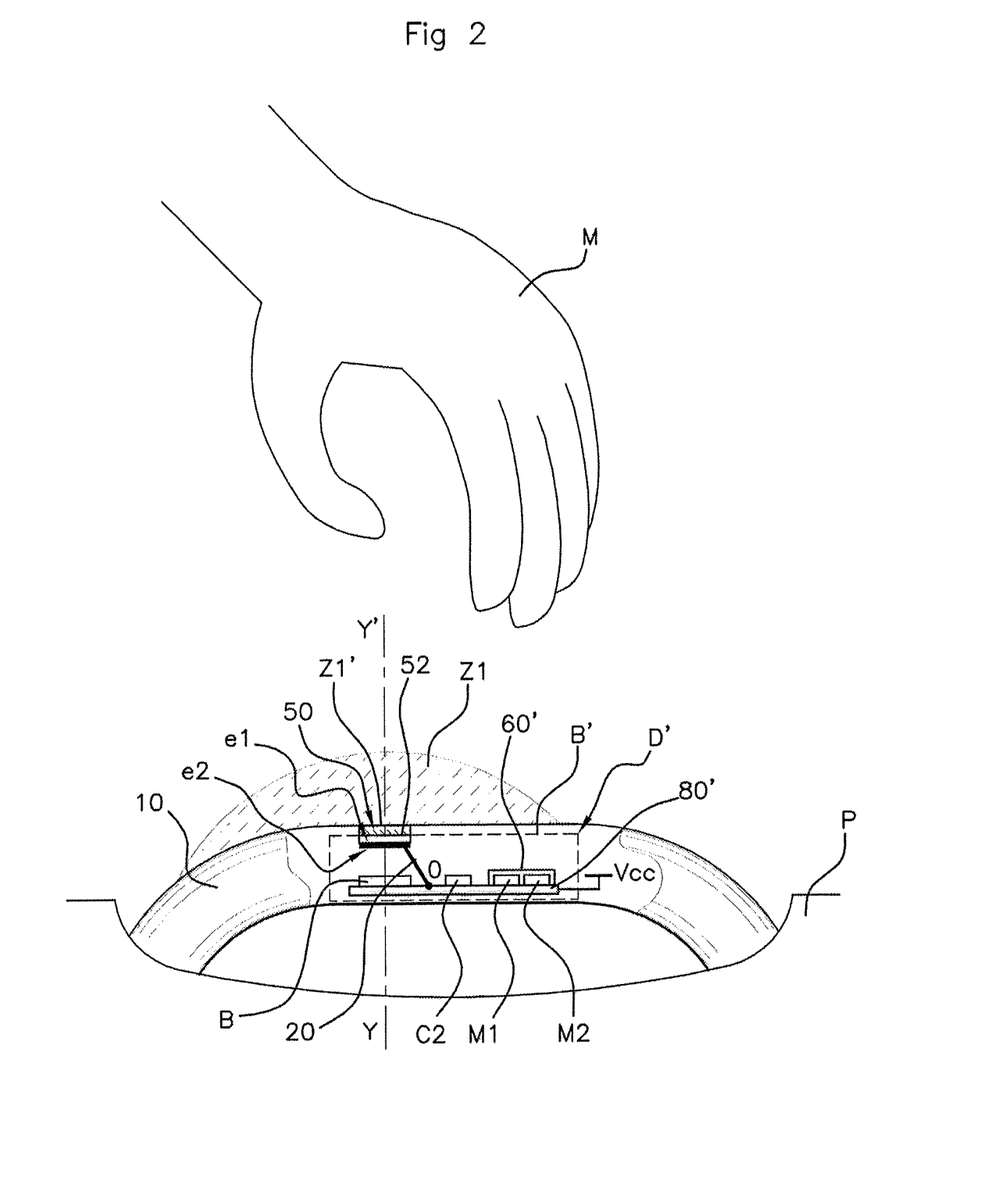

The detection device D' according to an aspect of the invention is illustrated in FIG. 2.

Said detection device D' takes the form of a casing B' integrated into the handle 10 and comprises, as in the prior art, a printed circuit board 80 and at least one means for detecting the approach and contact of the hand of the user on the handle 10 and a voltage source Vcc.

However, contrary to the prior art, in which the means for detecting approach and contact consisted of a capacitive sensor (locking electrode E1 or unlocking electrode E2), an aspect of the invention here proposes that said means for detecting contact (see FIG. 3) furthermore comprise an inductive sensor comprising a coil B and an amagnetic metal target that is none other than a capacitive electrode E for detecting the approach of the hand M of the user, i.e. a locking or unlocking electrode.

According to an aspect of the invention, the device D' for detecting the intention to lock or unlock for a door P of a motor vehicle (see FIG. 2) therefore comprises:
  a coil B,
  a movable electrode E a first face e1 of which is oriented toward the handle 10, and a second face e2 of which is located facing the coil B, along an axis Y-Y', and that is able to move from a rest position, in proximity to the handle 10, to a final position, in proximity to the coil B, under the effect of a contact of the user on the handle 10,
  a capacitor C2 connected to ground.

The coil B consists of a winding of copper wire, for example printed on the printed circuit board 80. The movable electrode E consists of a plate of conductive metal, aluminum for example. Since the electrode E is movable, it is not printed on the printed circuit board 80, said movable electrode E being a rigid plate made of aluminum located away from said printed circuit board 80 and electrically connected to the printed circuit board 80 by a conductive flexible link 20 having a pivot point 0.

A first face e1 of the movable electrode E is oriented toward the handle 10; more precisely, the movable electrode E is, in a rest position, located in proximity to the handle 10, and preferably in contact with an internal face of the casing B', which casing is itself inserted into the handle 10.

A second face e2 of the movable electrode E is located facing the coil B, along the axis Y-Y'. The movable electrode E moves, during the contact of the user on the handle 10, along the axis Y-Y', from its rest position located in proximity to the handle 10 to a final position, located close to the coil B and thus gets closer to said coil B.

The movable electrode E made of aluminum and the coil B thus form an inductive sensor, the movable target of which consists of the movable electrode E.

The press of the hand M of the user on the handle 10, for example along the axis Y-Y' (see FIG. 2), deforms said handle, and thus the casing B', locally. The deformation causes the conductive flexible link 20 to pivot about the pivot point 0 and hence the movable electrode E to move along said axis Y-Y', this bringing the movable electrode E and the coil B closer together.

To this end, preferably, the casing B' comprises a first portion 52 that is elastically deformable along the axis Y-Y', comprising a zone of contact 50 with the handle 10, and the movable electrode E makes contact with the first portion 52 of the casing B'.

In order to accentuate the deformation of the handle 10 and to increase the movement of the movable electrode E toward the coil B, the handle 10 also comprises an elastically deformable zone Z1' that is aligned along the axis Y-Y' with the zone of contact 50, and of dimensions larger than or equal to those thereof.

Of course, advantageously, the elastically deformable zone Z1' of the handle is located in the locking or unlocking zone of the handle 10. Here, as illustrated in FIG. 2, an aspect of the invention is described with the elastically deformable zone Z1' considered to be located in the locking zone Z1. The detection device D' of an aspect of the invention is therefore placed facing the locking zone Z1 so as to detect the intention to lock the vehicle (see FIG. 2).

Of course, an aspect of the invention also applies to the detection of the intention to unlock the vehicle, and the detection device D' may be positioned facing the unlocking zone Z2 (not shown in FIG. 2).

The movable electrode E generates, at its terminal (the other terminal being "virtual" and formed by the hand M of the user, which is connected to ground), in the presence of a second electrode nearby, in the present case in the presence of the hand M of the user, which is connected to ground, a variable capacitance Cx, which is a function of the distance separating said movable electrode E from the hand M of the user.

Measurement of the variation £Cx in the capacitance Cx therefore allows the approach of the hand M toward the handle to be detected and an intention to lock or unlock to be validated. However, this prior-art method, based solely on capacitive detection, has drawbacks as described above.

Figure 3:
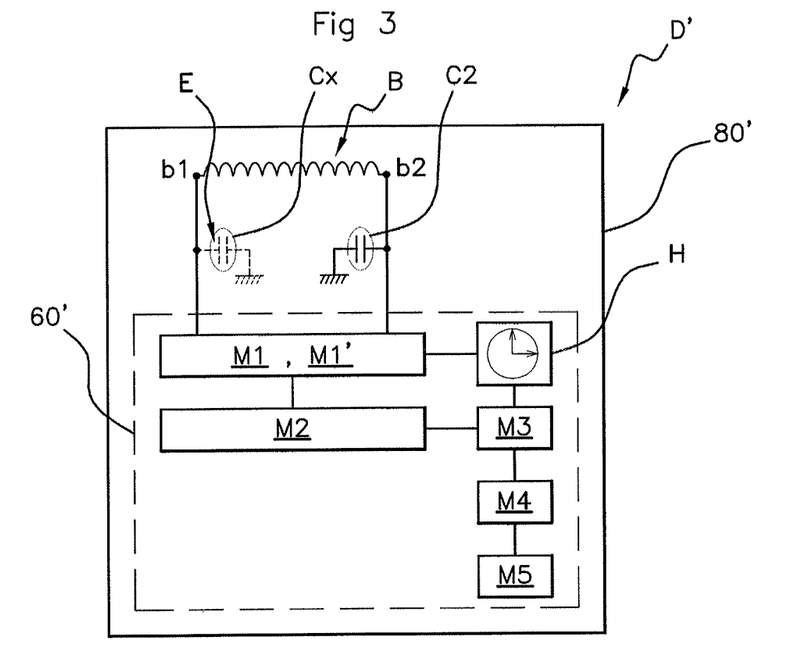
FIG. 3 shows an electronic schematic of the detection device D' comprising a clock, means for storing times in memory, duration-computing means, and duration-comparing means, according to a second embodiment of an aspect of the invention, FIG. 4 schematically shows the variation in the resonant frequency F of the detection device D' as a function of time t, during the approach of the user toward the handle then during the contact of the user with the handle.

As illustrated in FIG. 3, the movable electrode E, the coil B, and the capacitor C2 are connected together so as to form a resonant oscillating circuit of the "LC" type, where L represents the inductance of the resonant oscillating circuit (in the present case here the inductance of the coil B) and C is the capacitance of the resonant circuit. In FIG. 3, a first terminal b1 of the coil B is connected to the movable electrode E and a second terminal b2 of the coil B is connected to the capacitor C2.

The resonant oscillating circuit possesses an intrinsic resonant frequency F. As is described below, the resonant frequency F varies as a function of the variation ΔCx in the capacitance of the movable electrode E, and as a function of the position of the movable electrode E with respect to the coil B. Said resonant frequency F decreases when the user approaches the handle 10 and increases when the user grips the handle and the electrode E moves toward the coil B in its final position.

In the resonant oscillating circuit shown in FIG. 3, the capacitance C of the resonant oscillating circuit varies with the variation ΔCx in the capacitance Cx and is given by:

$$C = \frac{(Cx + \Delta Cx) \times C2}{(Cx + \Delta Cx) + C2}$$

Where:
Cx: is the capacitance of the movable electrode E,
ΔCx: is the variation in the capacitance Cx of the movable electrode E,
C2: is the capacitance of the capacitor C2.

The detection device D', according to an aspect of the invention, also comprises:
  means M1 for oscillating the frequency of the resonant oscillating circuit and means M1' for measuring a resonant frequency F of said resonant oscillating circuit,
  means M2 for comparing the resonant frequency F thus measured to thresholds, and more particularly to a first threshold F1 and to a second threshold F2,
  means 60' for controlling the frequency-oscillating means M1, the measuring means M1' and the frequency-comparing means M2.

In order to implement the detection method, the detection device D' furthermore comprises:
  a clock H,
  means M3 for storing times in memory, and more particularly for storing a first time T1 of passage of the resonant frequency F below the first threshold F1 and for storing a second time T2 of passage of the resonant frequency F above the second threshold F2,
  means M4 for computing a duration Δt between the first time T1 and the second time T2, and
  means M5 for comparing said duration Δt with a preset duration $\Delta t_{ref}$.

The clock H, the means M3 for storing times in memory, the duration-computing means M4 and the means M5 for comparing said duration may take the form of software, and be integrated into the control means 60' (microcontroller).

The frequency-oscillating means M1 and means M1' for measuring the resonant frequency may be comprised in a digital inductance converter.

The frequency-comparing means M2 take the form of software, and may be comprised in the control means 60', for example in a microcontroller.

The frequency-oscillating means M1, the measuring means M1' and the frequency-comparing means M2 may be integrated into the printed circuit board 80.

The resonant frequency F of the oscillating resonant circuit is given by the following equation:

$$F = \frac{1}{2 \times \pi \times \sqrt{(L \times C)}}$$

Namely:

$$F = \frac{1}{2 \times \pi \times \sqrt{\left(L \times \frac{(Cx + \Delta Cx) \times C2}{(Cx + \Delta Cx) + C2}\right)}}$$

Where:
L: is the inductance of the coil B,
π is a constant equal to 3.14,
Cx: is the capacitance of the movable electrode E,
ΔCx: is the variation in the capacitance Cx of the movable electrode E,
C2: is the capacitance of the capacitor C2.

Figure 5:
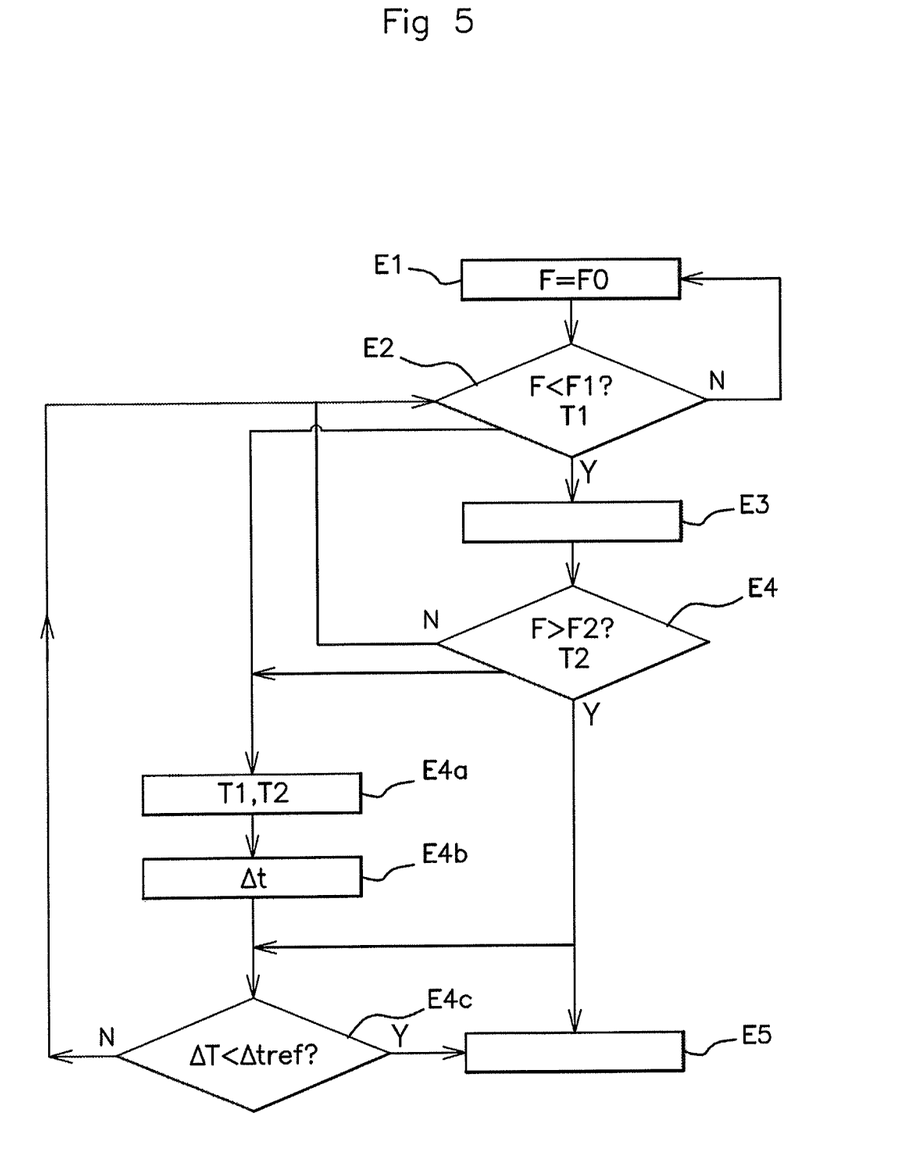
FIG. 5 is a flow chart showing the detection method according to an aspect of the invention.

The method for detecting the intention, of a user, to lock or unlock a motor-vehicle door, according to an aspect of the invention, is illustrated in FIG. 5 and is described below.

Initially (step E1), the frequency-oscillating means M1 excite the resonant oscillating circuit formed by the movable electrode E, the coil B and the capacitor C2. In the absence of a hand M in proximity to the handle (i.e. in proximity to the detection device D'), the value of the capacitance at the terminal of the movable electrode E is equal to Cx, and the resonant frequency F of the resonant circuit, which frequency is measured by the measuring means M1', is equal to:

$$F0 = \frac{1}{2 \times \pi \times \sqrt{\left(L \times \frac{Cx \times C2}{Cx + C2}\right)}}$$

When the hand M of the user approaches the handle 10, the value of the capacitance across the terminals of the movable electrode E gradually increases by ΔCx, and therefore the resonant frequency F decreases and equals:

$$F = \frac{1}{2 \times \pi \times \sqrt{\left(L \times \frac{(Cx + \Delta Cx) \times C2}{(Cx + \Delta Cx) + C2}\right)}}$$

The resonant frequency F reaches a minimum when the hand M of the user touches the handle 10, corresponding to the maximum variation ΔCxmax in the capacitance Cx of the movable electrode E.

$$F = \frac{1}{2 \times \pi \times \sqrt{\left(L \times \frac{(Cx + \Delta Cxmax) \times C2}{(Cx + \Delta Cxmax) + C2}\right)}}$$

Figure 4:
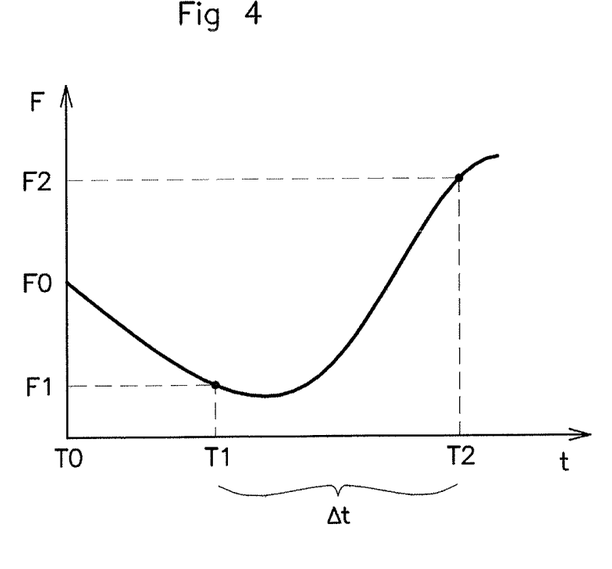

The frequency-comparing means M2 compare the resonant frequency thus measured to a first threshold F1 (step E2). When the resonant frequency F passes below a first threshold F1, at a first time T1 (see FIG. 4), then the detection of the approach of the hand of the user toward the handle 10 is validated (step E3) but the detection of the intention to lock or unlock the door is not validated, contrary to the prior art.

Next, subsequently, the user grips the handle 10. The press of the hand M on the handle 10 locally deforms said handle 10 (in the elastically deformable zone Z1') and the first portion 52 of the casing B' and causes the movable electrode E to move toward the coil B, along the axis Y-Y', as explained above.

Since the movable electrode E has a target function with respect to the coil B, when the movable electrode E gets closer to the coil B, the inductance L of the coil decreases, until it reaches a minimum value Lmin. The resonant frequency F of the resonant circuit then increases and equals:

$$F = \frac{1}{2 \times \pi \times \sqrt{\left(L\min \times \frac{(Cx + \Delta Cx) \times C2}{(Cx + \Delta Cx) + C2}\right)}}$$

The frequency-comparing means M2 compare the resonant frequency thus measured to a second threshold F2 (step E4).

If the resonant frequency F passes below the second threshold F2 at a second time T2, then the detection of contact is validated, but the detection of the intention to lock or unlock is not validated.

According to an aspect of the invention, the detection of the intention to lock or unlock the door is validated (step E5) only if:

the resonant frequency F passes below a first threshold F1, at a first time T1, and the resonant frequency F passes above a second threshold F2, at a second time T2, the first time T1 and the second time T2 being stored in memory (E4a), a duration Δt between said second time T2 and the first time T1 is calculated (E4b), and the duration Δt between the first time T1 and the second time T2 thus computed is shorter than a preset duration $\Delta t_{ref}$ (step E4c).

Ingeniously, the detection method of an aspect of the invention is therefore based on the use of the movable electrode E as:
an electrode for detecting the approach of the hand of the user,
an inductive sensor target, coupled to the coil B, once the hand has been placed on the handle 10,
a variable capacitor of the resonant oscillating circuit formed by the coil B and the capacitor C2.

Initially, the movable electrode E does not move and functions as a capacitive sensor for detecting the approach of the hand of the user. However, contrary to the prior art, the detection method according to an aspect of the invention does not continuously measure the variation ΔCx in the capacitance of the movable electrode E, but rather the resonant frequency F of the resonant oscillating circuit, that the movable electrode E forms with the coil B and the capacitor C2. Specifically, the resonant frequency F varies as a function of the variation ΔCx in the capacitance of the movable electrode E, due to the approach of the user.

The capacitor C2 is a matching capacitor that allows the frequency of the resonant oscillating circuit to be adjusted, and that allows said circuit to be made electrically coherent (since it is connected to ground).

Subsequently, the user presses on the handle 10 and the movable electrode E moves and functions as target of the inductive sensor, which is formed by said electrode E coupled to the coil B. Measurement of the variation in the resonant frequency F of the resonant oscillating circuit (due to the variation in the inductance L of the coil) here allows the approach of the movable electrode E toward the coil B to be detected, in a final position that means that the user has pressed on the handle 10.

The detection method of an aspect of the invention therefore comprises continuously measuring the resonant frequency F of the resonant oscillating circuit and comparing said frequency F to two successive thresholds, a first threshold F1, representative of the variation in the capacitance of the movable electrode E, due to the approach of the hand M of the user toward the handle 10, and a second threshold F2, higher than the first threshold F1, representative of the variation in the inductance of the coil B, due to the contact of the hand M of the user on the handle 10. If the value of the measured resonant frequency F is successively lower than the first threshold F1 at a first time T1, then higher than the second threshold F2 at a second time T2, and if the duration Δt between the first time T1 and the second time T2 is shorter than a preset duration $\Delta t_{ref}$, then the detection of the intention of the user to lock or unlock is validated (step E5).

Thus, in case of exterior perturbations, such as rain or snow on the handle 10, or humid ambient air that causes the resonant frequency F to pass below the first threshold F1, the detection of the intention to lock or unlock will not be validated, in so far as the resonant frequency will not then pass above the 2nd threshold within the preset length of time $\Delta t_{ref}$.

Conversely, in the case where vibrations or a slammed door cause the resonant frequency to pass above the 2nd threshold F2, the detection of the intention to lock or unlock will not be validated, in so far as the resonant frequency will not have passed beforehand below a first threshold F1.

In the case of metallic paint, the variation ΔCx in capacitance may cause the resonant frequency to drop below the first threshold F1, but a calibration specific to handles covered with metallic paint of the first threshold F1 will possibly remedy this problem. In addition, in any case the resonant frequency F will not exceed the second threshold F2 within the preset duration $\Delta t_{ref}$.

An aspect of the invention is particularly relevant in the case where a user approaches the handle without touching it. In this case, the resonant frequency F drops and may be lower than the first threshold F1, but in no case will it exceed, within the preset duration, the second threshold F2, the latter being set beforehand for the case where the movable electrode E is near the coil B in its final position.

The detection method of an aspect of the invention is therefore particularly robust and prevents false detections.

In the detection method according to an aspect of the invention, the first time T1 and the second time T2 are stored in memory, then a duration Δt between said second time T2 and the first time T1 is computed.

The duration Δ thus measured is then compared to a preset duration $\Delta t_{ref}$. The detection of the intention to lock or unlock is then validated only if the duration Δt is shorter than the preset duration $\Delta t_{ref}$.

The method of an aspect of the invention mitigates false detections due to the chance approach of the user close to the handle 10 without the intention of unlocking or locking his vehicle. In this case, the user approaches the handle 10 sufficiently for the resonant frequency F to pass below the first threshold F1, but he does not grip the handle, and the resonant frequency F does not pass below the second threshold F2 in an imparted length of time, namely the preset duration $\Delta t_{ref}$.

The preset duration $\Delta t_{ref}$ will have been measured beforehand and will correspond to a maximum duration required by the user to grip the handle 10.

An aspect of the invention therefore allows the intention of the user to lock or unlock his vehicle to be reliably and robustly detected.

The invention claimed is:

1. A method for detecting an intention of a user to lock or unlock a motor-vehicle door with a detection device integrated into a handle, said method comprising:
   continuously measuring a resonant frequency of said detection device and
   successively comparing said measured resonant frequency to a first threshold representative of an approach of the user and to a second threshold, higher than the first threshold, representative of contact of the user, the intention to lock or unlock the door being validated only if:
      a value of the measured resonant frequency is firstly lower than a first threshold, at a first measured time, then higher than the second threshold, at a second measured time, and
      a duration between the second measured time and the first measured time is shorter than a preset duration.

2. A device for detecting the intention of a user to lock or unlock a motor-vehicle door, said device being integrated into a handle and powered by a voltage source, the device comprising:
   a coil,
   a movable electrode a first face of which is oriented toward the handle, and a second face of which is located facing the coil, said movable electrode being able to move from a rest position, located in proximity to the handle, to a final position, located in proximity to the coil under the effect of a contact of the user on the handle,
   a capacitor connected to ground, the movable electrode, the coil and the capacitor being connected together in order to form a resonant circuit a resonant frequency of which varies as a function of a variation in the capacitance of the movable electrode, and of the position of the movable electrode, said resonant frequency decreasing when the user approaches the handle and increasing when the user grips the handle and the electrode moves to the final position,
   means for oscillating the frequency of said resonant circuit and means for measuring a resonant frequency of said resonant circuit,
   means for comparing the resonant frequency to a first threshold and to a second threshold,
   means for controlling the frequency-oscillating means, the measuring means and the frequency-comparing means,
   a clock,
   means for storing times in memory, said means being able to store a first time of passage of the resonant frequency below a first threshold and a second time of passage of the resonant frequency above a second threshold,
   means for computing a duration between the first time and the second time, and
   means for comparing said duration with a preset duration).

3. The detection device as claimed in, claim 2, wherein one terminal of the coil is connected to the movable electrode and a second terminal of the coil is connected to the capacitor.

4. The detection device as claimed in claim 3, wherein the coil and the capacitor are located on a printed circuit board and the movable electrode is able to move by way of a conductive flexible link electrically connecting said movable electrode to the printed circuit board and having a pivot point.

5. The detection device as claimed in, claim 2, wherein the coil and the capacitor are located on a printed circuit board and the movable electrode is able to move by way of a conductive flexible link electrically connecting said movable electrode to the printed circuit board and having a pivot point.

6. The detection device as claimed in claim 2, wherein the frequency-oscillating means, the measuring means and the frequency-comparing means are located on the printed circuit board.

7. The detection device as claimed in claim 2, wherein said device is integrated into a casing comprising a first portion, which is elastically deformable along a preset axis, having a zone of contact with the handle, and the movable electrode is, in a rest position, able to make contact with the first portion, and in a final position is in proximity to the coil.

8. A motor-vehicle door handle, comprising, a device as claimed in claim 2.

9. The handle as claimed in claim 8, further comprising at least one elastically deformable zone aligned along the preset axis with the zone of contact, of dimensions larger than or equal to the dimensions of the zone of contact.

10. A motor vehicle, comprising a device as claimed in claim 2.

* * * * *